United States Patent [19]

Kasahara

[11] Patent Number: 5,825,075
[45] Date of Patent: Oct. 20, 1998

[54] VARIABLE CAPACITANCE DIODE DEVICE AND METHOD OF MANUFACTURING SAME

[75] Inventor: Takeshi Kasahara, Tsurugashima, Japan

[73] Assignee: Toko Kabushiki Kaisha, Tokyo-To, Japan

[21] Appl. No.: 667,853

[22] Filed: Jun. 20, 1996

[30] Foreign Application Priority Data

Jun. 23, 1995  [JP]  Japan .................................. 7-180804

[51] Int. Cl.⁶ .................................................. H01L 29/93
[52] U.S. Cl. ......................... 257/596; 257/601; 257/602
[58] Field of Search ................................... 257/595, 596, 257/597, 598, 599, 600, 601, 602

[56] References Cited

U.S. PATENT DOCUMENTS

| | | |
|---|---|---|
| 4,456,917 | 6/1984 | Sato et al. . |
| 4,529,994 | 7/1985 | Sakai . |
| 5,220,193 | 6/1993 | Kasahara et al. ........................ 257/595 |
| 5,225,708 | 7/1993 | Kasahara ................................. 257/595 |

*Primary Examiner*—Ngân V. Ngâ
*Attorney, Agent, or Firm*—Cushman Darby & Cushman IP Group of Pillsbury Madison & Sutro LLP

[57] ABSTRACT

When a variable capacitance diode device is formed on each of chips obtained by cutting off a wafer, the capacitance values of the diode devices formed on the chips disperse for each wafer due to change in the manufacturing process conditions. To reduced the dispersion in capacitance value of the diode devices, a plurality of variable capacitance diodes (10A, 10B and 10C) are formed on the same semiconductor chip (2) in such a way that the areas of the PN junctions (4A, 4B and 4C) of the respective diodes are different from each other. Further, only one variable capacitance diode (e.g., 10C) which can satisfy a predetermined strict standard is selected and connected to a terminal (11) for use.

3 Claims, 4 Drawing Sheets

CAPACITANCE

CAPACITANCE

VARIABLE CAPACITANCE DIODE DEVICE AND METHOD OF MANUFACTURING SAME

BACKGROUND OF THE INVENTION

1. Field of the Invention

The present invention relates to a variable capacitance diode device and a method of manufacturing the same device, and more specifically to a variable capacitance diode which exhibits better uniformity of capacitance, thereby meeting strict standards.

2. Description of the Prior Art

Recently, variable capacitance diode devices have been widely used more and more in mobile high-frequency communications systems. Although the maximum capacitance of these devices is only a few pF in order to be useful in this field, the variations in capacitance from one diode device to the next must be kept very small.

In the case of the variable capacitance diode devices in the above-mentioned field, since the capacitance value is small, it is possible to reduce the chip area on which the diode device is formed. In other words, there is the advantage that a great number of chips can be formed from the same single wafer.

However, the production yield of variable capacitance diode devices is presently low due to tight specifications combined with a tendency for capacitance to vary from one diode to the next. The capacitance variation among diodes comes from two sources. The first source of variation is the differences in manufacturing conditions from one wafer to the next. These differences cannot be eliminated using conventional technology. The second source of variation comes from the position at which each diode device is formed on the wafer. The latter cause (i.e., the dispersion in capacitance value within the same wafer) can be reduced down to roughly a satisfactory level.

However, it is difficult to improve the former cause (i.e., the change in the manufacturing process conditions), because the manufacturing technology itself must be improved.

Presently, manufactured diode devices are selected by inspection. However, when the chip area decreases, it is difficult to inspect the diode devices in the wafer state. This is because when the inspection probe is brought into contact with the wafer, the risk of damaging the diode devices inevitably increases. Therefore, when the wafer is inspected, in general, the capacitance values of the diode devices are measured by sampling only some chip portions formed on the wafer.

Alternatively, the electrodes of the variable capacitance diode device formed on each cut-off chip can be connected to the chip terminals without inspecting the diode devices while still on the wafer. Then, after the finished diode has been encapsulated in resin, all the finished diode devices can be inspected.

In the case of the sampling inspection, the diode devices formed on the same wafer are accepted, so long as the distribution of the capacitance values of the diode devices formed on a single wafer satisfies the standard. When the standard is not satisfied, all the diode devices formed on the same wafer are rejected. Therefore, once rejected, all the diode devices formed on the single wafer are wasted.

Alternatively, if one performs total inspection of the finished variable capacitance diode devices, if rejected, the loss is relatively large, because the resin encapsulation cost is added to the chip cost. In particular, when the capacitance values of all the diode devices formed on almost all the chips obtained by a single wafer do not meet the standard, the cost damage is large.

It has been impossible using only inspection to effectively manufacture variable capacitance diode devices meeting strict standards and usable at high frequencies. Further, it has been difficult to decrease the dispersion in capacitance value of the diode devices by reducing the variation in manufacturing process conditions, because the manufacturing technology itself must be further improved.

SUMMARY OF THE INVENTION

Accordingly, it is the object of the present invention to provide a variable capacitance diode device and a method of manufacturing the same device, which can meet strict standards. That object is achieved by reducing the variation in capacitance value at the manufacturing stage where the electrode of the diode device is connected to an external terminal. This reduction can be successful in spite of variation in the capacitance values of the diode devices arising from the non-manageable manufacturing process conditions.

To achieve the above-mentioned object, the present invention provides a variable capacitance diode device, wherein: a plurality of PN junctions are formed on a same semiconductor chip to obtain a plurality of or a plurality of sets of variable capacitance diodes, respectively; areas of the formed PN junctions of a plurality of the variable capacitance diodes are different from each other, and areas of the formed PN junctions of a plurality of sets of the variable capacitance diodes are different from each other for each set; and only one or only one set of electrodes of the variable capacitance diodes is selected and connected to one or plural terminals, respectively for use.

Further, the present invention provides a method of manufacturing a variable capacitance diode device, which comprises the steps of: forming a plurality of variable capacitance diodes in unit of chip in a wafer in such a way that junction areas of the variable capacitance diodes are different from each other; inspecting the variable capacitance diodes by sampling the diodes in unit of chip; selecting one variable capacitance diode which satisfies a strictpredetermined standard ; obtaining the chip by cutting off the wafer; and connecting an independent electrode of the selected variable capacitance diode to a terminal for use.

Further, the present invention provides a method of manufacturing a variable capacitance diode device, which comprises the steps of: forming a plurality of variable capacitance diodes in unit of chip in a wafer in such a way that PN junctions of the formed variable capacitance diodes are divided into a plurality of sets and further areas of the divided PN junctions are different from each other for each set; inspecting the variable capacitance diodes by sampling the diodes in unit of chip; selecting one set of the variable capacitance diodes which satisfy a strictpredetermined standard; obtaining the chip by cutting off the wafer; and connecting independent electrodes of the selected set of the variable capacitance diodes to plural terminals, respectively for use.

In the variable capacitance diode device according to the present invention, since a plurality of variable capacitance diodes are formed on a single chip in such a way that the areas of the PN junctions of the variable capacitance diodes are different from each other or from each set, it is possible to select only one or only one set of the variable capacitance diodes which can satisfy a strict standard for each wafer. As a result, even if the capacitance values of the variable capacitance diode devices formed in the chips differ for each wafer, it is possible to substantially reduce the variation in capacitance value of the variable capacitance diode devices.

DETAILED DESCRIPTION OF THE PREFERRED EMBODIMENTS

Some embodiments of the variable capacitance diode device according to the present invention will be described hereinbelow with reference to the attached drawings.

Figure 1:
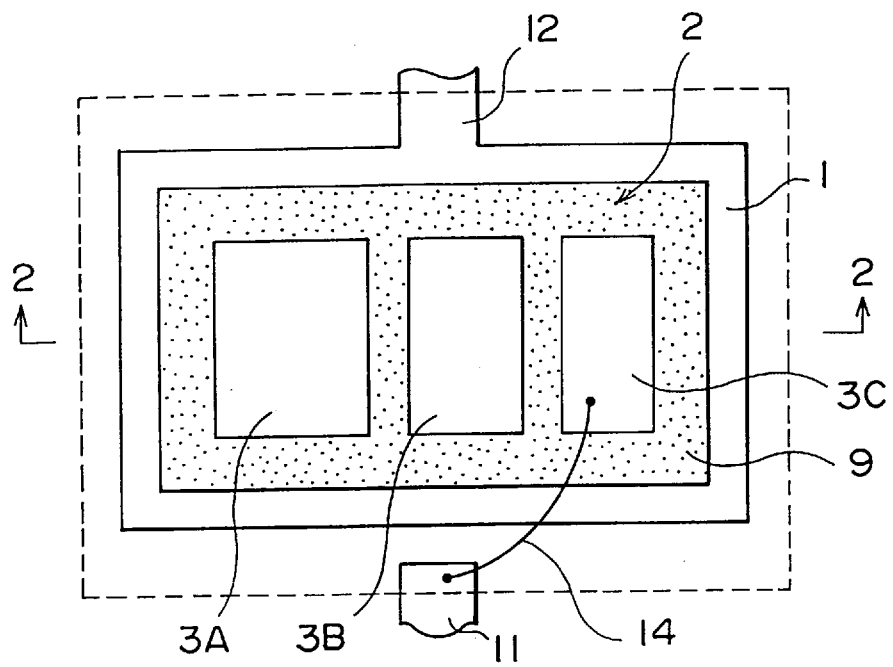
FIG. 1 is a plan view showing the variable capacitance diode device according to the present invention.
Figure 2:
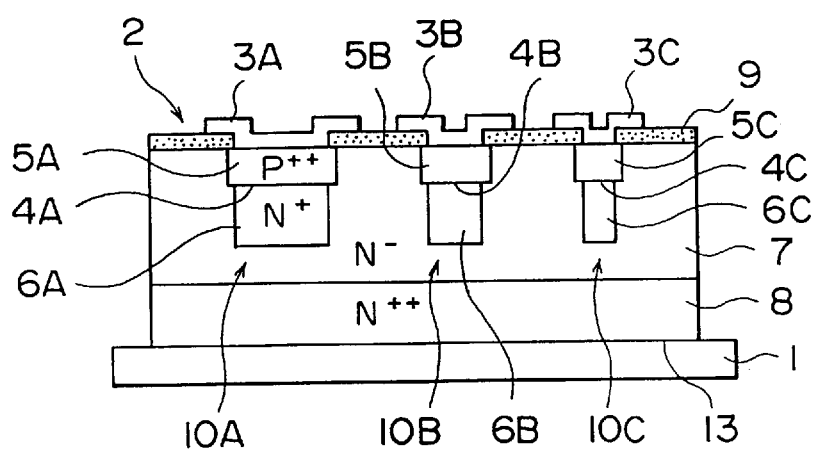
FIG. 2 is a cross-sectional view taken along the line A—A shown in FIG. 1.

FIGS. 1 and 2 show a first embodiment thereof, in which FIG. 2 is a cross-sectional view taken along the line A—A shown in FIG. 1.

In both the drawings, a semiconductor chip 2 formed of silicon is supported by a metal piece 1. In the chip 2, an $N^-$ type epitaxial layer 7 is formed on an $N^{++}$ type substrate 8. Further, three PN junctions 4A, 4B and 4C are formed within the epitaxial layer 7, to obtain three variable capacitance diodes 10, 10B and 10C, respectively.

In more detail, two diffusion regions 5A and 6A are formed in the epitaxial layer 7 so as to form the PN junction 4A. The conductivity type of the diffusion region 5A is $P^{++}$ type and that of the diffusion region 6A is $N^+$ type. In the same way, the PN junction 4B is formed between a $P^{++}$ type diffusion region 5B and an $N^+$ type diffusion region 6B, and the PN junction 4C is formed between a $P^{++}$ type diffusion region 5C and an $N^+$ type diffusion region 6C. Further, three independent aluminum electrodes 3A, 3B and 3C are formed in contact with three surfaces of the three diffusion regions 5A, 5B and 5C, respectively. These three independent electrodes 3A, 3B and 3C are three anode electrodes of the three variable capacitance diodes 10A, 10B and 10C, respectively.

Here, as shown in FIG. 2, the area of the PN junction 4A is the largest, that of the PN junction 4B is the medium, and that of the PN junction 4C is the smallest. Therefore, the capacitance values of the diode 10A is the largest, that of the diode 10B is the medium, and that of the diode 10C is the smallest.

The principal surface of the chip 2 on which the independent electrodes 3A, 3B and 3C are formed is covered with an insulating film 9. However, a common electrode 13 is formed on the opposing principal surface thereof. This common electrode 13 is an electrode connected in common to the three cathode electrodes of the diodes 10A, 10B and 10C formed on the chip 2. The common electrode 13 is fixed to the metal piece 1 in the state of an eutectic crystal alloy relative to the metal piece 1.

Further, when the capacitance value of the diode 10C satisfies a strict predetermined standard or strict specifications, only the independent electrode 3C of the variable capacitance diode 10C is connected via a lead 14 to a terminal 11 exposed to the outside of a hardened resin, so that only the diode 10C can be used. In other words, the independent electrodes 3A and 3B of the two other diodes 10A and 10B are not connected to any terminals, so that these two diodes 10A and 10B are not used.

Further, in FIG. 1, the resin hardened to encapsulate the chip 2 is shown by dashed lines. A terminal 12 formed integral with the metal piece 1 is used to lead the common electrode 13 to the outside.

The method of manufacturing the variable capacitance diode device constructed as described above will be described hereinbelow with reference to FIGS. 3(a) to 3(d).

Figure 3A:
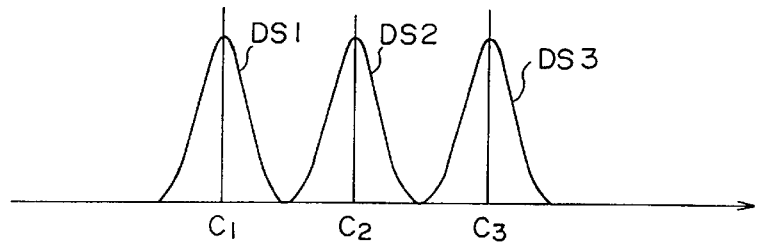
FIGS. 3(a) to 3(c) are graphical representations showing the difference in capacitance distribution curve among three different wafers, respectively, in which each drawing indicates three dispersions in capacitance value of three diodes 10A, 10B or 10C formed on the same chip in the same wafer, respectively, obtained midway during the manufacturing process of the variable capacitance diode devices according to the present invention.
Figure 3B:
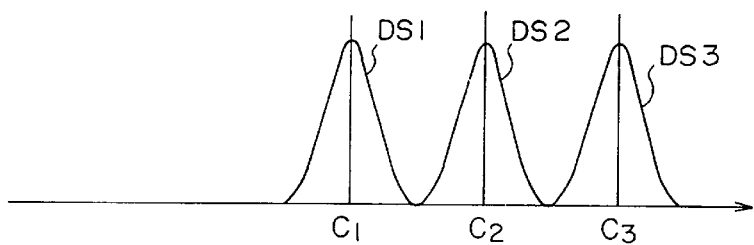
Figure 3C:
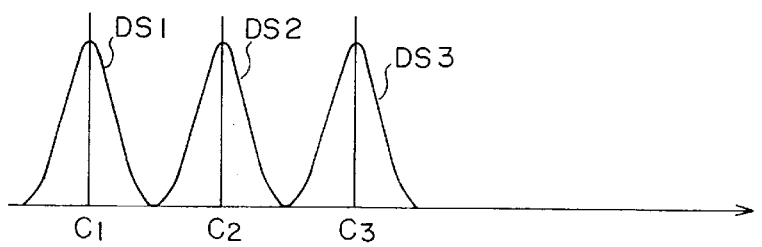

FIGS. 3(a) to 3(c) show the difference in capacitance distribution curve among three different wafers, respectively, in which each drawing indicates three dispersions in capacitance value of three diodes 10A, 10B or 10C formed on the same chip in the same wafer, respectively. Here are some examples. FIG. 3(a) shows data from one wafer, FIG. 3(b) shows data from a second wafer, and FIG. 3(c) shows data from a third wafer. Curve DS1 in FIG. 3(a) represents the distribution of capacitance values of all the diodes formed on the first wafer having the same predetermined area. The abscissa in these curves designates the capacitance, and the ordinate designates the number of devices. Curve DS2 in FIG. 3(a) represents the distribution of capacitance values of the diodes on the first wafer formed with a second predetermined area different from the area for the diodes represented by DS1. Curve DS3 represents diodes with a third area different from DS1 and DS2. Curve DS1 in FIG. 3(b) represents the distribution of capacitance values of all the diodes on the second wafer formed with the same predetermined area as in DS1, FIG. 3(a). These drawings are obtained midway during the manufacturing process of the variable capacitance diode devices according to the present invention.

Figure 3D:
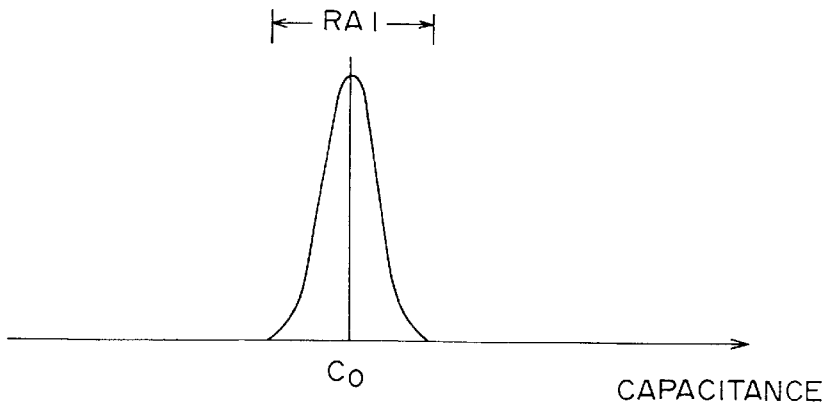
FIG. 3(d) is a graphical representation showing a substantial distribution curve indicative of the dispersion in capacitance value of the variable capacitance diode devices according to the present invention.

FIG. 3(d) shows the distribution of capacitance values for all the variable capacitance diode devices selected for use and connected to terminals according to the present invention in all three wafers. In these drawings, the abscissa designates the capacitance, and the ordinate designates the number of devices.

In the variable capacitance diode device according to the present invention, since three diodes 10A, 10B and 10C are formed on the same chip, there exist three distributions of the capacitance values.

Here, the three diodes 10A, 10B and 10C formed on the same chip are designed in such a way that the capacitance value of the middle diode 10B matches the central value $C_0$ of the chosen standard.

In the case of the wafer showing the distribution as shown in FIG. 3(a), since the central capacitance value $C_2$ of the middle distribution curve DS2 of the middle capacitance diode 10B matches the design or standard value $C_0$, the distribution curve DS2 satisfies the strict standard. Therefore, the independent electrode 3B of the middle diode 10B of the chip 2 (obtained by cutting off the wafer) is connected to the terminal 11, to finish the variable capacitance diode device. In this case, only the diode 10B can be used. The other remaining diodes 10A and 10C are not used.

In the case of the wafer showing the distribution as shown in FIG. 3(b), since the central capacitance value $C_1$ of the left distribution curve DS1 of the smallest capacitance diode 10C matches the design or standard value $C_0$, the distribution curve DS1 satisfies the strict standard. Therefore, the independent electrode 3C of the smallest capacitance diode 10C of the chip 2 (obtained by cutting off the wafer) is connected to the terminal 11, to finish the variable capacitance diode device. In this case, only diode 10C can be used as shown in FIG. 1.

In the case of the wafer showing the distribution as shown in FIG. 3(c), since the central capacitance value $C_3$ of the right distribution curve DS3 of the largest capacitance diode 10A matches the design or standard value $C_0$, the distribution curve DS3 satisfies the strict standard. Therefore, the independent electrode 3A of the largest capacitance diode 10A of the chip 2 (obtained by cutting off the wafer) is connected to the terminal 11, to finish the variable capacitance diode device. In this case, only diode 10A can be used.

Therefore, when any one of the three diodes 10A, 10B and 10C of the single variable capacitance diode device according to the present invention is selected as described above, it is possible to obtain the narrow distribution range RA1 of the capacitance values of the diode devices, as shown in FIG. 3(d). As a result, it is possible to accept almost all the diode devices, in spite of the narrow acceptable range RA1 as shown in FIG. 3(d).

Here, in the same wafer, the difference of the distributions in capacitance value between the three diodes 10A, 10B and 10C formed in the same chip; that is, the intervals between the two of the three central capacitance values C1, C2 and C3 of the three distribution curves DS1, DS2 and DS3 as shown in FIG. 3(a) can be determined freely in the design of the diode device.

Further, when the dispersion in capacitance value of the three diodes formed on the same chip due to change in the non-manageable manufacturing process conditions (which differ for each wafer) is previously known, it is preferable to determine the intervals between the two of the three central capacitance values C1, C2 and C3 in such a way that the distribution of any one (preferably the middle diode 10B) of the three diodes roughly matches the central capacitance value $C_0$ of the standard.

Further, the three distributions can be examined by sampling inspection. In this case, however, it is unnecessary to inspect all the variable capacitance diodes 10A, 10B and 10C formed on each of the sampled diode devices. For instance, when only the diodes 10B are examined by sampling, it is possible to predict the distributions of the other remaining diodes 10A and 10C at a high precision.

In summary, since the three distributions of the capacitance values of the three diodes are different for each wafer due to the change in non-manageable manufacturing process conditions, in the variable capacitance diode device according to the present invention, any one of the three variable capacitance diodes which can satisfies the strict standard is selected for use.

Figure 4A:
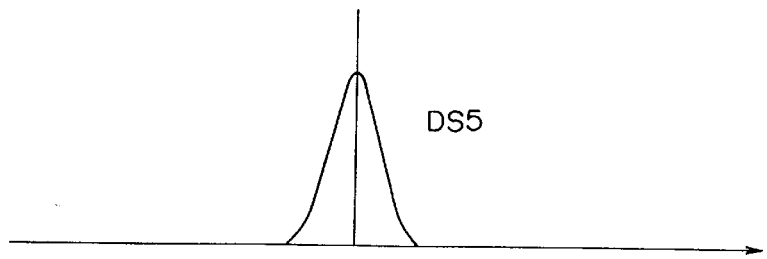
FIGS. 4(a) to 4(c) are graphical representations showing the difference in capacitance distribution curve among three different wafers, respectively, in which each drawing indicates one dispersion in capacitance value of diodes formed in the same wafer, obtained midway during the manufacturing process of the prior art variable capacitance diode devices.
Figure 4B:
Figure 4C:
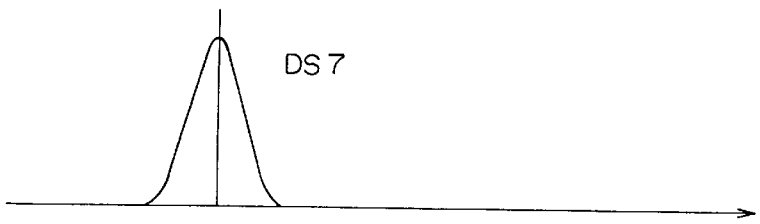

In contrast with this, FIGS. 4(a) to 4(c) show the difference in capacitance distribution curve among three different wafers, respectively, in which each drawing indicates one dispersion in capacitance value of the diodes formed on the chips. These drawings are obtained midway during the manufacturing process of the prior art variable capacitance diode device.

Figure 4D:
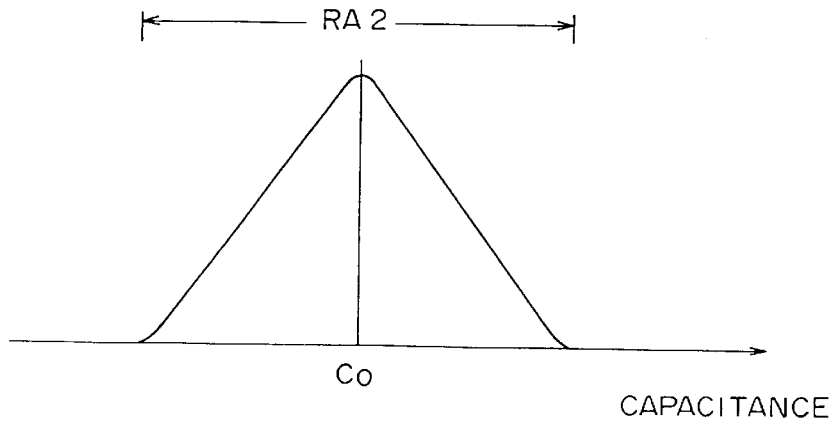
FIG. 4(d) is a graphical representation showing a substantial distribution curve indicative of the dispersion in capacitance value of the prior art variable capacitance diode devices.

FIG. 4(d) shows a substantial distribution curve indicative of the dispersion in capacitance value of the prior art variable capacitance diode devices formed on the chips obtained by three different wafers. Further, in these drawings, the abscissa designates the capacitance, and the ordinate designates the number of devices, respectively.

In the prior art variable capacitance diode device, since only one diode is formed on the chip, there exists only one distribution curve indicative of the capacitance values of one diode. However, the central capacitance value of one distribution curve differs for each wafer during the manufacturing process thereof.

FIG. 4(a) indicates that the distribution curve DS5 indicative of the dispersion in capacitance value of the diodes formed in the chips of a wafer meets a strict standard having narrow tolerances. However, FIGS. 4(b) and 4(c) indicate that the distribution curves DS6 and DS7 indicative of the dispersions in capacitance value of the diodes formed on two different wafers are located on both sides of the distribution curve DS5 and outside a standard having narrow tolerances.

Accordingly, the capacitance values of the prior art variable capacitance diode devices formed on the chips obtained from the three different wafers fall in a wide capacitance range RA2 as shown in FIG. 4(d). Therefore, when such a wide capacitance acceptable range RA2 is set as the standard, although the diode devices can be accepted, if the narrow capacitance acceptable range RA1 as shown in FIG. 4(d) is set as the standard, many diode devices are to be rejected.

Figure 5:
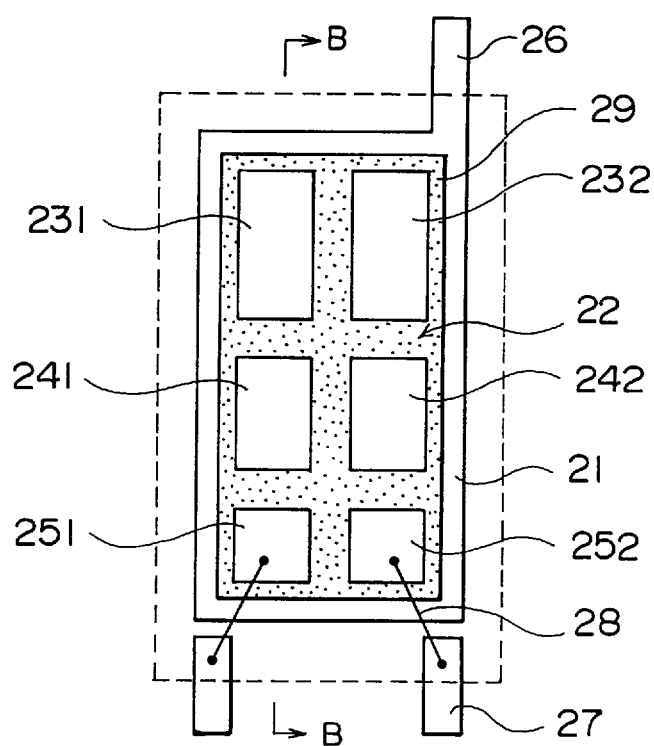
FIG. 5 is a plan view showing the variable capacitance diode device of a second embodiment according to the present invention.

On the other hand, in the variable capacitance diode devices according to the present invention, since the diode devices are so constructed in such a way that whichever of the three diodes most closely satisfies the strict standard can be selected and used, it is possible to meet a standard with stricter tolerances. FIG. 5 is a plan view showing a second embodiment of the variable capacitance diode device according to the present invention. In FIG. 5, a semiconductor chip 22 formed of silicon is supported by a metal piece 21. Further, in FIG. 5, six independent electrodes are formed. In more detail, the two independent electrodes 231 and 232 are connected to two PN junctions of the same largest area; the two independent electrodes 241 and 242 are connected to two PN junctions of the same middle area; and the two independent electrodes 251 and 252 are connected to two PN junctions of the same smallest area, respectively. Further, in FIG. 5, an insulating film 29 is also shown.

In summary, in this second embodiment, three pairs of variable capacitance diodes are formed on the same chip. The PN junction areas of both members of any given pair are the same, but the PN junction areas of the other pairs vary from one pair to another.

This second embodiment is adopted suitably when two variable capacitance diodes of the same characteristics are required. In other words, since the PN junction areas of a pair of the variable capacitance diodes are the same with respect to each other, the characteristics thereof are also almost the same with respect to each other, so that a pair of the diodes which can satisfy the strict standard are selected and used.

In FIG. 5, the two independent electrodes 251 and 252 are connected to two terminals 27 via two leads 28, respectively. Therefore, a pair of two diodes connected to these independent electrodes 251 and 252 are selected and used. Further, when the chip 22 is taken along the line B—B as shown in FIG. 5, the same cross-sectional area as shown in FIG. 2 can be obtained.

In the manufacturing method of the variable capacitance diode device of the second embodiment according to the present invention, as shown in FIG. 5, a plurality of PN junctions are formed on a same semiconductor chip to obtain a plurality of variable capacitance diodes, respectively; and the formed PN junctions are divided into a plurality of pairs (or sets) in such a way that areas of the formed PN junctions of a plurality of the variable capacitance diodes are different from each other for each pair (or set). Further, the distributions of the capacitance values of the three diode pairs (or sets) are examined for each pair (or set) by sampling inspection, and a pair (or set) of the diodes which can satisfy the strict standard is selected and used.

As described above, in the variable capacitance diode device according to the present invention, since a plurality of variable capacitance diodes or a plurality of pairs (or sets) of variable capacitance diodes are formed on the same single chip, even if the capacitance values of the formed diodes disperse for each wafer due to change of the non-manageable manufacturing process conditions midway during the manufacturing process, it is possible to select and use the diode or the diode pair (or set) which can satisfy the strict standard for each wafer. In other words, it is possible to manufacture the variable capacitance diode devices of high frequency so as to satisfy a strict standard. In addition, since almost all the manufactured diode devices can be accepted for each wafer, it is possible to manufacture the variable capacitance diode devices effectively; that is, to increase the production yield of the variable capacitance diode devices.

What is claimed is:

1. A variable capacitance diode device, comprising:

a semiconductor chip;

a plurality of PN junctions formed on the semiconductor chip to obtain a plurality of or a plurality of sets of variable capacitance diodes, each PN junction having an area chosen for the purpose of creating a capacitance associated therewith, the areas of each of the formed PN junctions of a plurality of the variable capacitance diodes being different from the areas of each of the other diodes, or the areas of each of the formed PN junctions in a plurality of sets of the variable capacitance diodes being different from the areas of each of the diodes in each of the other sets;

a common electrode of the respective variable capacitance diodes formed on one of the principal surfaces of the semiconductor chip and a plurality of independent electrodes of the variable capacitance diodes formed on the other of the principal surfaces of the semiconductor chip, being separated for each variable capacitance diode, only one or only one set of independent electrodes of the variable capacitance diodes being selected and connected to one or plural terminals, respectively, for use together with the common electrode connected to a different terminal.

2. A variable capacitance diode device, comprising:

a semiconductor chip;

a plurality of PN junctions formed on the semiconductor chip to obtain a plurality of variable capacitance diodes, each PN junction having an area for the purpose of creating a capacitance, the areas of the formed PN junctions of a plurality of the variable capacitance diodes being different from each other;

a common electrode of the respective variable capacitance diodes formed on one of the principal surfaces of the semiconductor chip; and a plurality of independent electrodes of the variable capacitance diodes formed on the other of the principal surfaces of the semiconductor chip, being separated for each variable capacitance diode, only one of the independent electrodes of the variable capacitance diodes being selected and connected to one terminal for use together with the common electrode connected to a different terminal.

3. A variable capacitance diode device, comprising:

a semiconductor chip;

a plurality of PN junctions formed on the semiconductor chip to obtain a plurality of variable capacitance diodes, each PN junction having an area for the purpose of creating a capacitance in the variable capacitance diode, the formed PN junctions being divided into a plurality of sets in such a way that the areas of each of the formed PN junctions of a plurality of the variable capacitance diodes are the same within each set, but are different from the areas of each of the diodes in the other sets;

a common electrode of the respective variable capacitance diodes formed on one of the principal surfaces of the semiconductor chip; and a plurality of independent electrodes of the variable capacitance diodes formed on the other of the principal surfaces of the semiconductor chip, being separated for each variable capacitance diode, only one set of independent electrodes of the variable capacitance diodes being selected and connected to plural terminals, respectively, for use together with the common electrode connected to a different terminal.

* * * * *